United States Patent
Farnworth et al.

(10) Patent No.: US 6,169,329 B1
(45) Date of Patent: *Jan. 2, 2001

(54) SEMICONDUCTOR DEVICES HAVING INTERCONNECTIONS USING STANDARDIZED BONDING LOCATIONS AND METHODS OF DESIGNING

(75) Inventors: Warren M. Farnworth, Nampa; Alan G. Wood, Boise, both of ID (US)

(73) Assignee: Micron Technology, Inc., Boise, ID (US)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 08/627,680

(22) Filed: Apr. 2, 1996

(51) Int. Cl.[7] .............................. H01L 23/48; H01L 29/52; H01L 27/04; H01L 23/12
(52) U.S. Cl. .................... 257/780; 257/772; 257/778; 257/738; 257/693; 257/725; 438/613; 438/118
(58) Field of Search .......................... 257/780, 777, 257/778, 723, 730, 738, 673, 693, 697, 735, 725, 737, 686, 685; 438/613, 118

(56) References Cited

U.S. PATENT DOCUMENTS

| | | | |
|---|---|---|---|
| 4,772,936 | 9/1988 | Reding et al. | 257/648 |
| 4,948,754 | 8/1990 | Kondo et al. | 438/613 |
| 4,998,159 | * 3/1991 | Shinohara et al. | 257/780 |
| 5,138,434 | 8/1992 | Wood et al. | 361/397 |
| 5,168,345 | 12/1992 | Brossart | 257/668 |
| 5,216,278 | * 6/1993 | Lin et al. | 257/688 |
| 5,239,198 | * 8/1993 | Lin et al. | 257/693 |
| 5,281,151 | * 1/1994 | Arima et al. | 257/778 |
| 5,289,346 | * 2/1994 | Carey et al. | 361/777 |
| 5,291,062 | * 3/1994 | Higgins, III | 257/693 |
| 5,311,037 | * 5/1994 | McShane | 257/723 |
| 5,327,008 | 7/1994 | Djennas et al. | 257/666 |
| 5,334,857 | * 8/1994 | Mennitt et al. | 257/786 |

(List continued on next page.)

FOREIGN PATENT DOCUMENTS

| | | | |
|---|---|---|---|
| 0486829 A2 | 5/1992 | (EP) . | |
| 0692823 A1 | 7/1994 | (EP) . | |
| 0622847 A2 | 11/1994 | (EP) . | |
| 0684644 A1 | 11/1995 | (EP) . | |
| 0085244 | * 5/1982 | (JP) | 257/737 |
| 0132150 | * 5/1989 | (JP) | 257/723 |
| 0036857 | * 2/1993 | (JP) | 257/725 |
| WO97/37374 | 10/1997 | (WO) . | |

OTHER PUBLICATIONS

European Search Report dated Jun. 2, 1999.
Patent Abstracts of Japan, Publication No. 05129366, dated May 25, 1993.
Patent Abstracts of Japan, Publication No. 59229850, dated Dec. 24, 1984.

(List continued on next page.)

*Primary Examiner*—Alexander O. Williams
(74) *Attorney, Agent, or Firm*—Trask Britt

(57) ABSTRACT

A process for making a semiconductor device and the resulting device having standardized die-to-substrate bonding locations are herein disclosed. The semiconductor die provides a standardized ball grid or other array of a particular size, pitch and pattern such that as the size, configuration or bond pad arrangement of the die changes, a standard substrate (the term including leadframes) having a similarly standardized array of terminals or trace ends can be employed to form a semiconductor device. It is also contemplated that dies having markedly different circuitry but a common array pattern may be employed with the same substrate or other carrier.

38 Claims, 6 Drawing Sheets

U.S. PATENT DOCUMENTS

| | | | |
|---|---|---|---|
| 5,355,283 | | 10/1994 | Marrs et al. .......................... 257/687 |
| 5,365,409 | | 11/1994 | Kwon et al. .......................... 257/666 |
| 5,376,825 | * | 12/1994 | Tukamoto et al. ................... 257/685 |
| 5,379,191 | | 1/1995 | Carey et al. .......................... 257/778 |
| 5,399,903 | | 3/1995 | Rostoker et al. ..................... 257/666 |
| 5,424,492 | | 6/1995 | Petty et al. ........................... 174/250 |
| 5,440,171 | * | 8/1995 | Miyano et al. ....................... 217/723 |
| 5,454,160 | * | 10/1995 | Nickel .................................... 29/840 |
| 5,483,101 | * | 1/1996 | Shimoto et al. ..................... 257/723 |
| 5,490,040 | * | 2/1996 | Gaudenzi et al. ................... 361/773 |
| 5,490,324 | * | 2/1996 | Newman .............................. 257/686 |
| 5,497,397 | * | 3/1996 | Hershey et al. . |
| 5,498,767 | | 3/1996 | Huddleston et al. ..................... 437/8 |
| 5,502,289 | * | 3/1996 | Takiar et al. ......................... 257/661 |
| 5,506,756 | | 4/1996 | Haley ................................... 257/778 |
| 5,521,435 | * | 5/1996 | Mizukoshi ............................ 257/780 |
| 5,523,622 | * | 6/1996 | Harada et al. ........................ 257/777 |
| 5,593,927 | | 1/1997 | Farnworth et al. .................. 438/113 |
| 5,604,379 | | 2/1997 | Mori ..................................... 257/778 |
| 5,643,830 | * | 7/1997 | Rostoker et al. . |
| 5,646,828 | * | 7/1997 | Degani et al. ........................ 257/778 |
| 5,677,576 | | 10/1997 | Akagawa .............................. 257/785 |
| 5,683,942 | * | 11/1997 | Kata et al. . |
| 5,715,144 | * | 2/1998 | Ameen et al. ........................ 257/686 |
| 5,726,489 | * | 3/1998 | Matsuda et al. ..................... 257/659 |
| 5,741,729 | * | 4/1998 | Selna .................................... 438/125 |
| 5,817,986 | * | 10/1998 | Davidson et al. ................... 174/250 |
| 5,844,304 | | 12/1998 | Kata et al. ............................ 257/738 |

OTHER PUBLICATIONS

"*Activity Report of CSP Study Group*" and "*Chip Size Package*" (two frames), JWG#2–8, San Diego, Jun. 1995, 1 page.

Letter from Avi Ben–Har to Warren Farnworth, dated Mar. 27, 1996 (1 page) transmitting on Mar. 28, 1996 a copy of Zilber, G., et al., *Slimcase—A Thin Chip Size, Integrated Circuit Package* (8 pages), to have been presented at ISHM—MCM Conference, Denver Colorado, Apr. 18, 1996.

One (1) page copy of two overhead projections shown at a Semiconductor Industry Conference in San Diego, California in June, 1995.

\* cited by examiner

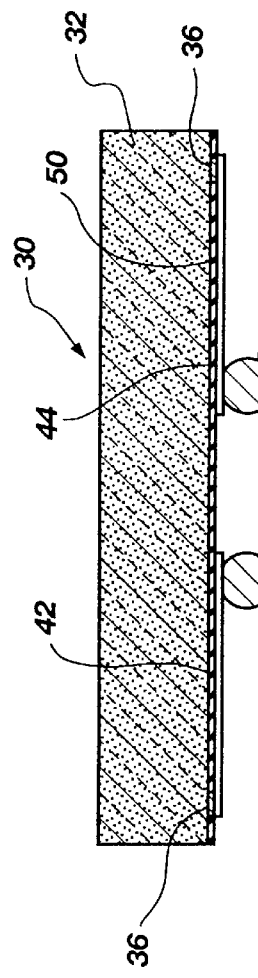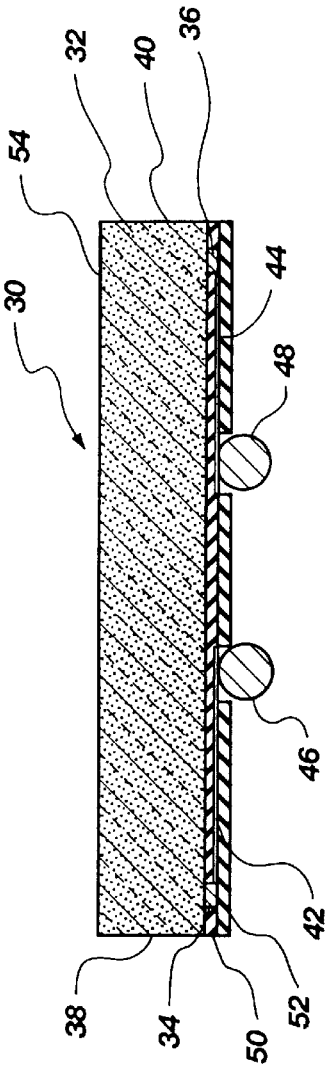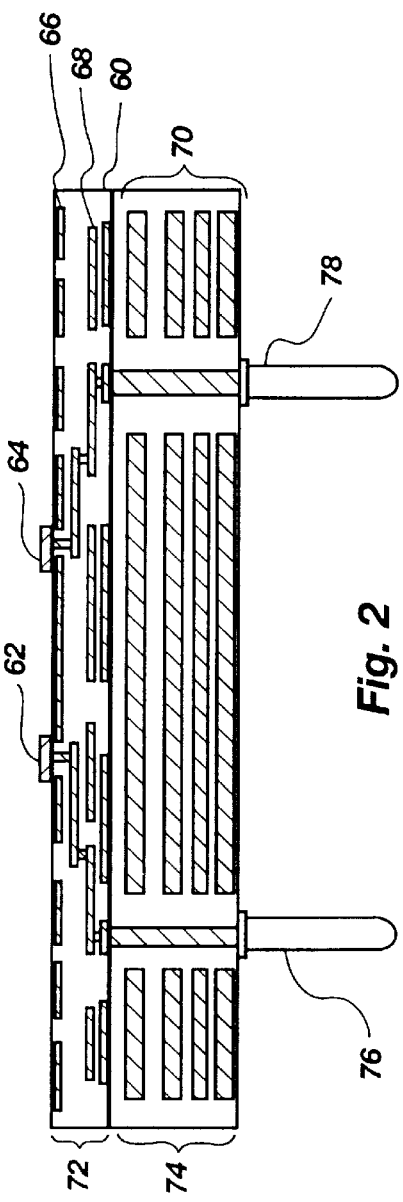

SEMICONDUCTOR DEVICES HAVING INTERCONNECTIONS USING STANDARDIZED BONDING LOCATIONS AND METHODS OF DESIGNING

BACKGROUND OF THE INVENTION

1. Field of the Invention

This invention relates generally to a process for forming semiconductor die-to-substrate conductor interconnections and, more specifically, to a process for forming standardized bonding locations for varying die sizes, configurations, bond pad arrangements and circuitry, and a semiconductor die assembly formed therefrom.

2. State of the Art

The first integrated circuits became available in the late 1960s having a minimal number of circuits on each chip of silicon. These first components typically included aluminum or gold-based, thin-film traces to integrate the active and passive devices embedded in the silicon. Since these first simple semiconductor devices, the circuit count per die has grown exponentially. In the early 1970s, bipolar logic chips had about 100 circuits and monolithic memory had 128 bits forming the first commercial, bipolar main memory. Since then, the number of logic circuits has grown to over 10,000 per chip (bipolar) and one gigabit memory chips, with FET transistors replacing bipolar.

The active component or device integration and densification process in integrated circuits has motivated a continuous and ongoing migration of intercircuit wiring and connections from boards, cards, and modules to the chip itself. The surface of the chip, with its multilayer wiring, has become a microcosm of the conductor and insulator configurations that were common on previous multilayer printed-circuit boards and multilayer ceramic packages. A logic chip with 700 circuits and three layers of wiring has approximately 5 m of aluminum wiring on a chip less than 5 mm square. There are over 17,000 via connections from level to level through a micron-thick insulator film of $SiO_2$. Yet, the conductor capacity in the chip greatly lags behind the densification of the silicon devices. Most of the area of the chip (approximately two-thirds), still serves as a platform for the wiring.

Heretofore, serial wirebonding of one or two rows of bond pad input/outputs (I/Os) around the perimeter or down the center of the chip to leads, and sometimes buses of a leadframe, has satisfied the needs of most ceramic or plastic dual in-line packages. Automated wirebonding today is very fast, efficient, and reliable compared to the manual bonding of the 1960s. Wirebonding, however, appears to be yielding for some applications to TAB bonding, in which the density of perimeter connections can be doubled or tripled and all bonds made simultaneously. Solder-bumped connections have evolved into an area array or pattern configuration in which a large portion of the surface of the chip is covered with controlled collapse chip connections (C4s) for the highest possible I/O counts. Unlike wirebonding, C4 usually dictates solder bump formation on the active surface of the chip when the chip is in wafer form. Typically, in such structures, a layer of silicon oxide, silicon nitride, or polyimide passivation must be formed over the final wiring level on the active surface of the chip before formation of the bumps. This has become a commonplace precaution to protect the fine wiring from corrosion and mechanical damage, even in advanced wirebonded chips.

Solder-bump interconnection was initiated in the early 1960s to eliminate the expense, unreliability, and low productivity of manual wirebonding. Whereas the initial, low-complexity, low circuit density chips typically required only peripheral contacts or bond pads, solder-bump technology has allowed considerable extendibility in I/O density as it progressed to full-population area arrays. Typically, C4s utilize solder bumps deposited on wettable metal pads on the chip and a matching footprint of solder wettable terminals at the ends of circuit traces carried by the substrate. The upside-down chip (commonly referred to as a flip chip) is aligned to the substrate, and all joints are made simultaneously by reflowing the solder. It is also known to employ conductive polymer bumps or polymers loaded with conductive particles in lieu of solder bumps in arrays. Fine pitch bump arrays have been generally termed "ball grid arrays," or "BGAs," in the art.

In addition to the densification of C4s or other conductive bumps on a given die (also interchangeably referred to in the art as a "chip"), technological advances in the art have decreased the overall size of semiconductor dies (for a given circuit density). Further, due to ongoing advances in circuit component design and fabrication technology, a given die may be "shrunk" one or more times during its commercial lifespan to enhance per-wafer yield, device speed and performance, and quality. In addition, similar dies from different manufacturers may be of different size and/or shape, but are adaptable to use on the same printed circuit board or other conductor-carrying substrate. Consequently, the need to allow for varying sized dies for a given substrate has been recognized. For example, U.S. Pat. No. 5,168,345 discloses a substrate having a plurality of conductive leads arranged in a generally radial pattern to which dies of various sizes may be attached. Likewise, in U.S. Pat. No. 5,327,008, a universal leadframe is disclosed which is suitable for use with many different die sizes. In both of the foregoing patents, bond wires are employed to connect die bond pads to lead frame leads.

Such arrangements, however, are not practical for bump-type interconnections (flip-chip bonding) of dies having markedly different bond pad patterns thereon, due to the precise mutual locational requirements of the bump interconnections and the matching terminals or other connector structures on a substrate or other carrier. Thus, it would be advantageous to provide a bumped die to which a standardized array of terminals or trace ends of a substrate or other carrier such as a leadframe could be bonded, regardless of die size or bond pad pattern. Thus, a single substrate or leadframe conductor configuration might be employed to accommodate different generations of the same die or different die altogether.

SUMMARY OF THE INVENTION

Accordingly, the present invention comprises a process of making a semiconductor die having a standardized array of external connections formed thereon and the resulting die and die assembly. That is, a given semiconductor die has a set pattern, pitch and size (also termed an array) of external connections formed on its active surface so that it may physically and electrically mate with a substrate or other carrier having a substantially identical standardized array of trace ends, terminals or other contact structures. As the size of the die is reduced during product development, the newly formed die (commonly referred to as a shrink) has the same configuration and size of array of external connections formed thereon for joining with a substrate. Thus, a single substrate trace end or terminal configuration matching the external connection pattern of the first, oversize generation of a given die will also be usable for subsequent generations of smaller dies.

Similarly, dies from different manufacturers or other dies having differing bond pad patterns may be reconfigured according to the invention with identical I/O bump patterns. For example, a die with two parallel rows of peripheral bond pads, a die with one or two central rows of pads, a die with a hybrid pad pattern of a central pad row with a transverse peripheral row of pads at each end, and a die with pads along all four sides may be reconfigured to a common I/O array pattern.

The die of the invention has a plurality of external contact or connect (bond) pads formed on its surface, to which a plurality of external connections residing on the die are connected by conductive traces extending between the contact pads and the external connections. The contact pads and traces may be at least partially covered by a dielectric material, such as a polyimide or other suitable material known in the art.

In a preferred embodiment, the size of the die employing a standardized external connection (I/O) array can be reduced at least twice for a given integrated circuit device, one such exemplary device being a sixty-four megabit dynamic random access memory (DRAM) die. Moreover, the die size can be reduced in one lateral (x,y) dimension or two without compelling a change in the arrangement of the standardized connection array.

In one preferred embodiment, the I/O array is organized in a series of substantially mutually parallel rows and perpendicular columns. In another embodiment, the array is organized in a pattern of parallel rows with I/O connections of each row offset from an adjacent one. In yet another embodiment, the array forms a substantially rectangular configuration with interconnections positioned only about the perimeter of the rectangle.

In yet another embodiment, the array is organized into at least one row of connectors. If one row is utilized, the row may be formed along a center line of the die, along a side or anywhere in between. If two rows are utilized, the rows may be adjacent one another flanking a center line of the die, proximate opposing sides of the die, or flanking one side of the die with I/O connections of each row offset to minimize pitch.

In still another embodiment, the I/O array is configured with one or two central rows of connections having a transverse row of connections at one or both ends thereof along a side of the die.

In a further embodiment, the I/O array is of circular configuration, employing one or more concentric rings of connections.

A significant aspect of the invention is that any selected single, standardized trace-end array pattern substrate can be utilized for succeeding generations of ever-smaller semiconductor dies including substantially the same integrated circuit, or a circuit that "looks" the same electrically to external devices. That is, regardless of the specific external connection configuration, the layout of external connections remains constant for subsequent reduced-sized, or shrunken, dies.

Another significant aspect of the invention is the ability to interchange dies of different manufacture and having different bond pad arrangements by standardizing their external connections.

Still another significant aspect of the invention is the ability to mount dies with markedly differing bond pad arrangements to a single lead frame having inner lead ends configured to contact the bond pads of each die. Such interchangeability may be effected by reconfiguring the diverse I/O pattern on the different dies to a common one for connection to the leadfraane leads.

Yet another significant aspect of the invention is the ability to connect dies having different circuitry to a substrate or other carrier employing a standardized terminal or trace end array.

BRIEF DESCRIPTION OF THE DRAWINGS

FIG. 2 is a partial cross-sectional view of a die-and-substrate semiconductor device in accordance with the present invention;

FIG. 2A is a partial cross-sectional view of a variation of the die I/O connection structure depicted in FIG. 2;

DETAILED DESCRIPTION OF THE ILLUSTRATED EMBODIMENT

Figure 1:
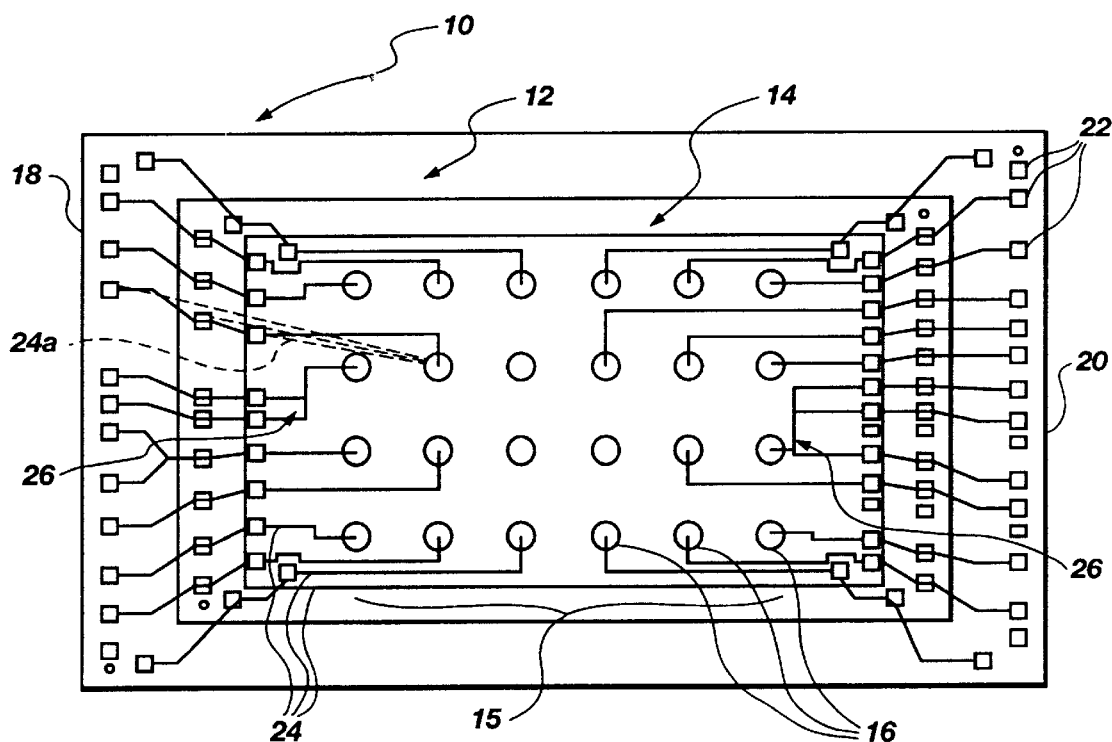
FIG. 1 is a top view of a three-generation progression of a first embodiment of a semiconductor die in accordance with the present invention.

Referring to FIG. 1, an exemplary semiconductor die 10 in accordance with the present invention is shown. The die 10 is the first generation of a series of increasingly-smaller dice 12 and 14 including the same integrated circuit, such as a DRAM. The dies 10, 12, and 14 each have an array of external connections 16 and spacing formed on their active surfaces. As can be seen, the external connections 16 maintain a constant configuration and spacing for each generation of shrinking dies 10, 12, and 14. That is, the size and locations of the external connections 16 remain constant from one generation of die 10 to the next 12, and so on, to the smallest die shrink, in this case die 14. An exemplary configuration of the external connections 16, as shown in FIG. 1, is a generally rectangular array 15 comprised of a series of substantially mutually perpendicular rows and columns of external connections 16.

Proximate the first and second ends 18 and 20, respectively of the dies 10, 12, and 14, are a plurality of die contact or connect (bond) pads 22. The pads 22 is connected to remote external connections 16 through circuit runs or traces 24 extending from selected pads 22 to the external connections 16. As shown, traces 24 may electrically connect all or a portion of the external connections 16 to the pads 22. Moreover, some of the traces 24 may merge with others as shown at 26 along their paths as design requirements and preferences dictate. Because the external connections 16 are in a predetermined, fixed location for each generation of dies 10, 12, and 14, the traces 24 between the pads 22 and the external connections 16 generally decrease in length from one generation to the next. It should be noted that traces 24 are shown extending from bond pads 22 of the first generation 10 of the die through those of the two succeeding shrinks 12 and 14 for purposes of clarity and identification of corresponding bond pads of each die generation. However, in practice, traces 24 of each generation may be routed more directly from a bond pad 22 to its corresponding external connection 16 as shown by exemplary broken line traces 24a on FIG. 1.

As shown in FIG. 2, a bare die device 30, representative of a device in accordance with the present invention, includes a semiconductor die 32 having rows of pads 34 and 36 (perpendicular to the plane of the drawing figure) proximate its ends 38 and 40, respectively. Circuit runs or traces 42 and 44 extending over a passivation layer (typically silicon dioxide or silicon nitride) on the die active surface are used to connect the pads 34 and 36 to external connections 46 and 48, respectively (such as solder or conductive epoxy balls or polymer balls containing conductive particles for forming a ball grid array (BGA), or other connectors as known in the art). Runs or traces 42, 44 may be formed by methods known in the art, such as sputtering (low melt metals), stencilling (conductive inks or polymers), or may be preformed before application to die 32 as by metallization of a polymer film (such as polyimide) and formation of circuit traces thereon, such structures being commonly referred to as TAB (tape automated bonding) tape, or, more generically, as flex circuits. The trace material and dielectric are not critical to the invention as long as performance parameters are met.

As shown in FIG. 2, traces 42 and 44 may reside on a polymer film layer 50 and may be sandwiched between layer 50 and a cover layer 52, although neither layer is a requirement of the invention. Layers 50 and 52 may be formed of a polyimide or other suitable dielectric material, preformed or formed in situ, each such layer, if employed, being (by way of example) approximately 6 μm thick. As shown in FIG. 2A, traces 42 and 44 may reside on a dielectric layer 50, no cover layer 52 being employed. The FIG. 2A structure is particularly suitable for a flex circuit-type bond pad rerouting structure. The layers 50 (and 52, if used) also incidentally provide additional protection to delicate circuitry on the surface 54 of the die 32. Layers 50 and 52 may also comprise a siloxane polyimide or a spin-on glass layer, as desired.

Any substrate 60 having terminals 62 and 64 oriented to match the location of the external connections 46 and 48, respectively, may be utilized to form a bare die device 30 in accordance with the present invention. As shown, the substrate 60 may be a combination thin- and thick-film package or any other substrate known in the art, such as a printed circuit board or other chip carrier element. The substrate trace ends or other terminals, such as terminals 62 and 64, are configured to mate with the external connections 46 and 48, respectively, or vice versa. Such a substrate 60 may include ground and signal circuitry 66 and 68 and power and ground circuitry 70. Thin- or thick-film layer 72 may be comprised of polyimide, or any other suitable material known in the art, and thick-film layer 74 may comprise a ceramic material, or some other appropriate material. The substrate 60 may also include I/O pins 76 and 78 for connection to higher-level packaging. As will be understood by those in the art, most of the details of the substrate 60 are not essential to the functionality of a bare die device 30 in accordance with the present invention and are merely provided for illustrative purposes.

The die 32 and cooperating substrate 60 may be mutually aligned by any suitable means known in the art, such as mechanical or optical alignment systems. If the latter is used, it is desirable to provide a so-called "null point" at the center of the die in the bump pattern to serve as a reference for translational and rotational alignment. Use of an optical system, such as a pattern recognition system, in combination with tight manufacturing tolerances, will permit use of extremely fine-pitch small ball or bump arrays in the smallest possible patterns.

FIGS. 3–8 illustrate various embodiments of the dies 10, 12, and 14 in accordance with the present invention and having varying configurations of the external connections 16. (For simplification purposes, the circuit runs or traces 24 extending from the bond pads 22 to the external connections 16 are not illustrated in FIGS. 3–8.)

Figure 3:
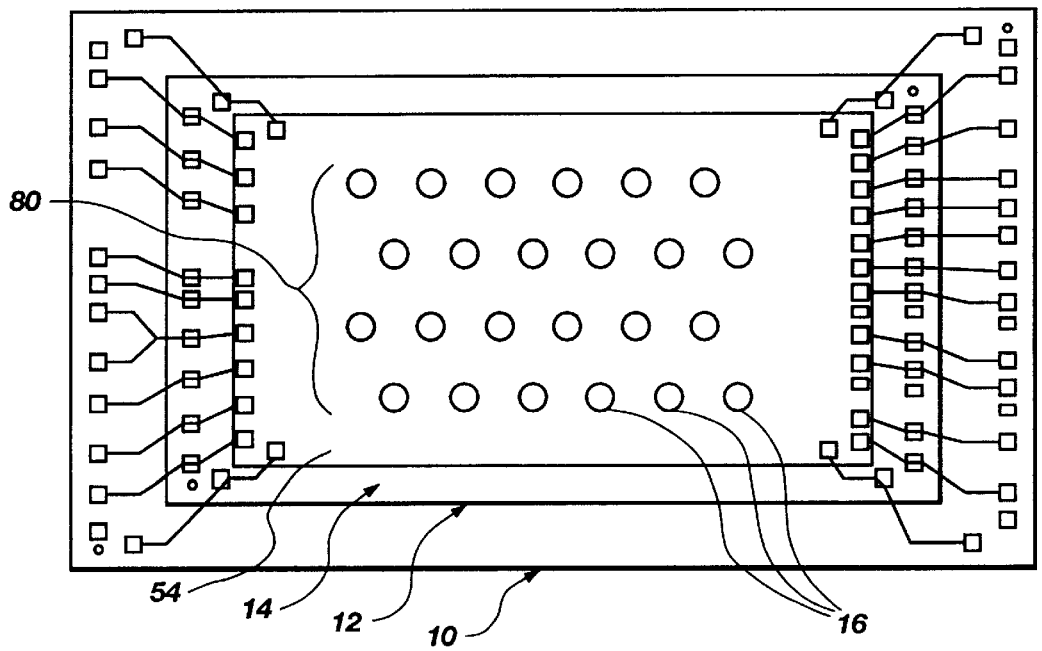
FIG. 3 is a top view of a three-generation progression of a second embodiment of a semiconductor device in accordance with the present invention.

The array 80 shown in FIG. 3 forms a staggered row pattern on the surface 54 of the die 10.

Figure 4:
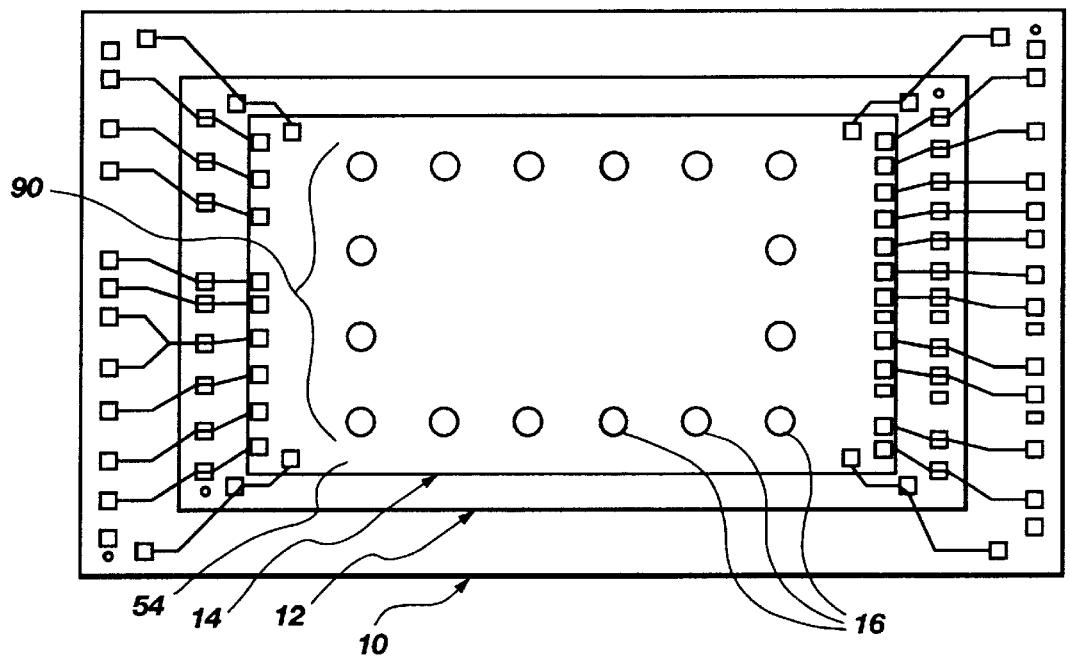
FIG. 4 is a top view of a three-generation progression of a third embodiment of a semiconductor device in accordance with the present invention.

In FIG. 4, the array 90 of external connections 16 forms the outline of a rectangle. Of course, a second, inner rectangle of external connections 16 might be added.

Figure 5:
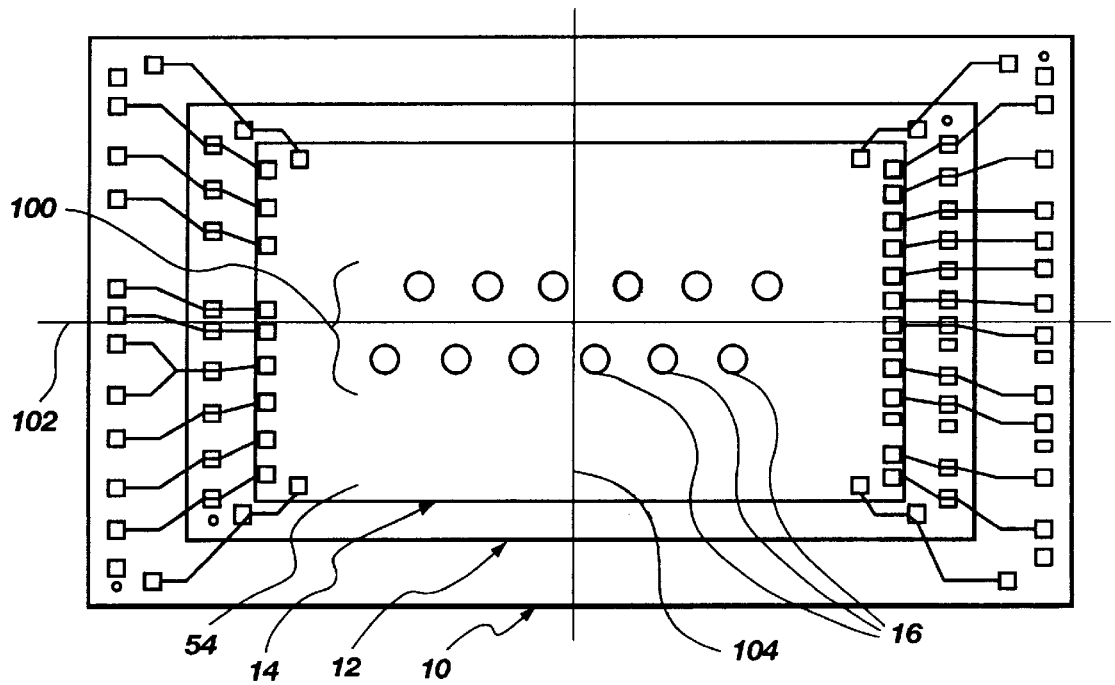
FIG. 5 is a top view of a three-generation progression of a fourth embodiment of a semiconductor device in accordance with the present invention.

In FIG. 5, the external connections 16 form an array 100 comprised of two rows of external connections 16 adjacent and flanking the center line 102 of the die 10. Each of the external connections 16 are slightly offset from corresponding external connections 16 in the other row in relation to a line 104 perpendicular to center line 102.

Figure 6:
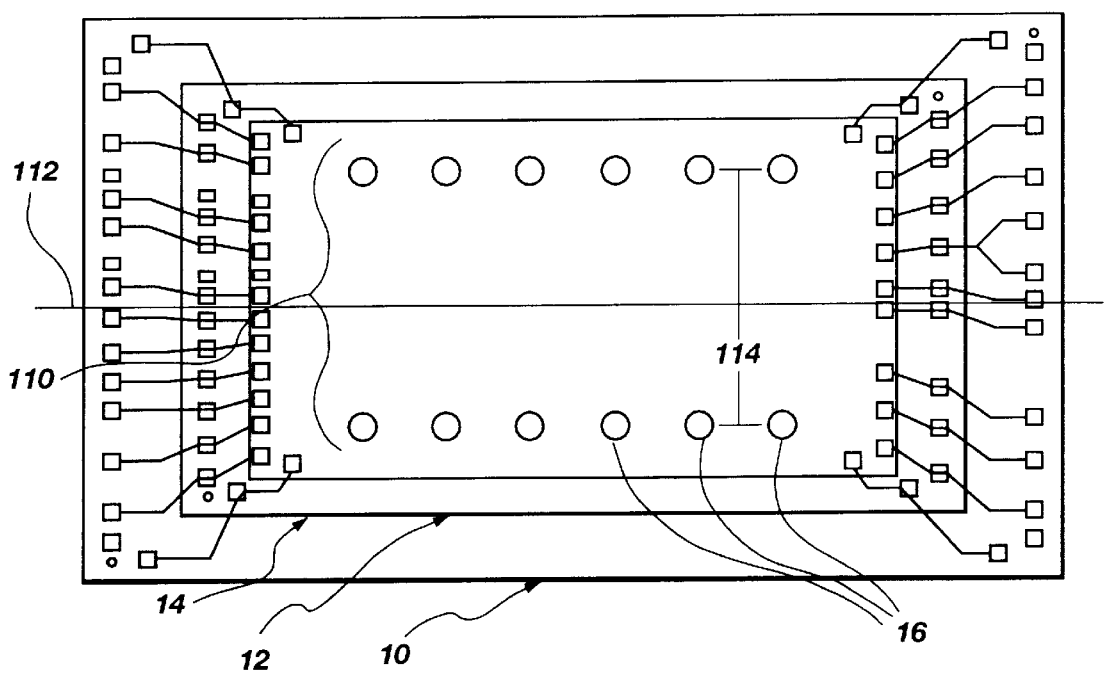
FIG. 6 is a top view of a three-generation progression of a fifth embodiment of a semiconductor device in accordance with the present invention.

Similarly, in FIG. 6, the array 110 is comprised of two rows of external connections 16, where the external connections 16, of one row are a mirror image of the other row about the center line 112 of the die 10 and are separated by a distance 114 so as to be close to the periphery of third-generation die 14.

Figure 7:
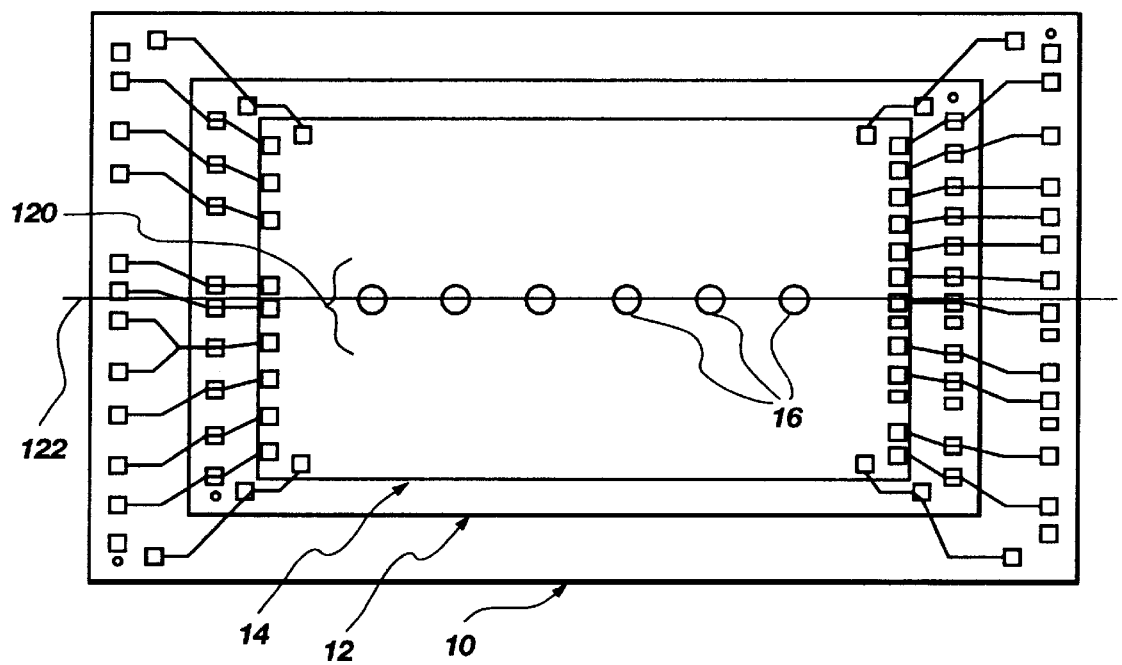
FIG. 7 is a top view of a three-generation progression of a sixth embodiment of a semiconductor device in accordance with the present invention.

In FIG. 7, the array 120 is formed by a single row of external connections 16 along the center line 122. As illustrated, the array 120 is comprised of six external connections 16. The number of external connections 16, however, may vary, depending on design parameters and required minimum number of I/Os.

Figure 8:
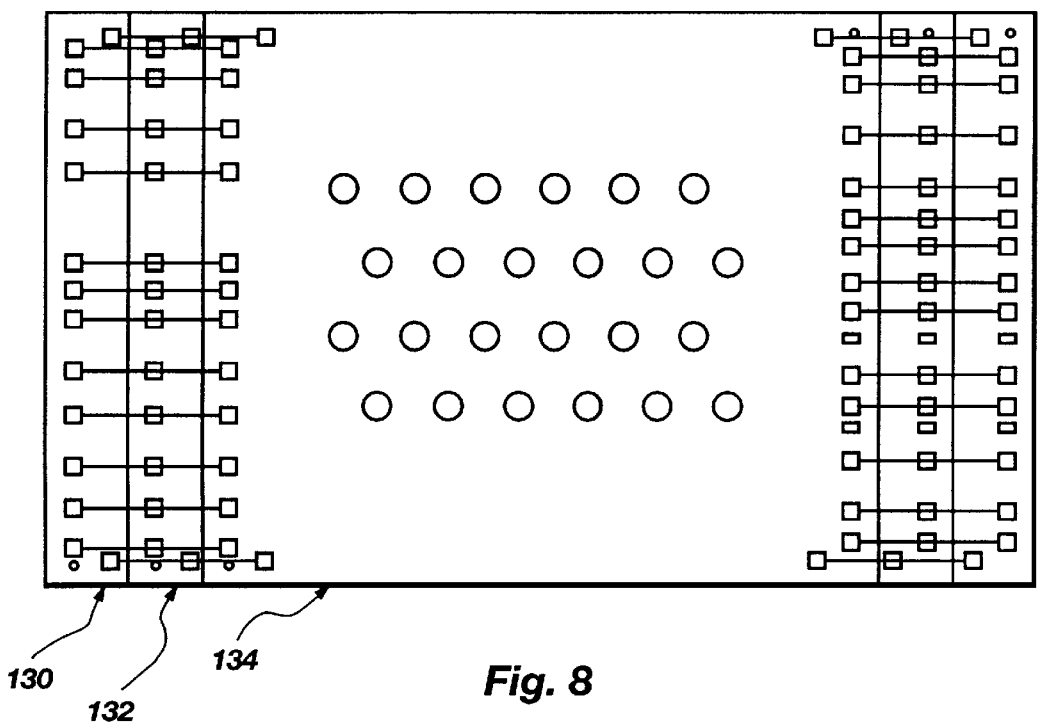
FIG. 8 is a top view of a three-generation progression of a seventh embodiment of a semiconductor device in accordance with the present invention.

FIG. 8 illustrates that the various dies 130, 132, and 134 representing three generations of die shrinks may not necessarily shrink in two or more dimensions. That is, the die 130 may simply be reduced with regard to its longitudinal length for the next generation of die 132. Similarly, the subsequent (third) generation of die 134 may only be reduced in one dimension, as illustrated.

Figure 9:
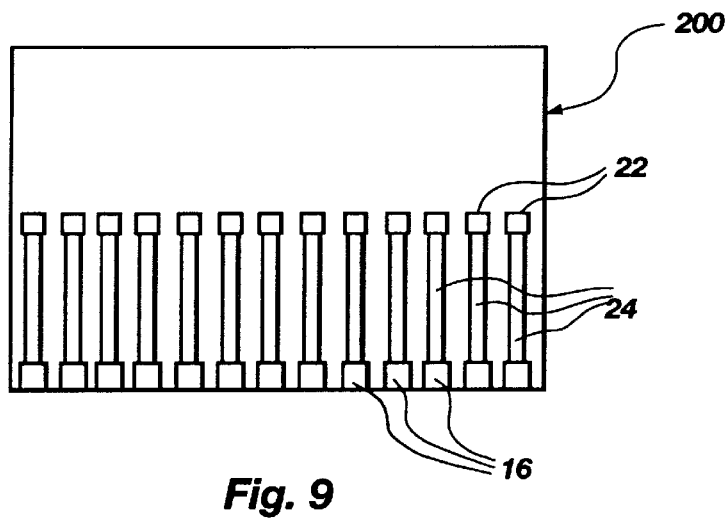
FIG. 9 is a top schematic view of a die with bond pads rerouted to I/O connections a single edge of the dies.

FIG. 9 illustrates a die 200 having a central row of bond pads 22 thereon reconfigured through the use of traces 24, as previously described, to an edge-connect configuration wherein I/O external connections 16 are disposed along one side of the die. It will also be recognized that external connections 16 may, in this instance, be other than conductive bumps and may (as shown) comprise plate-type contacts engagable with clip-type connectors of a carrier for a direct die connect or DDC arrangement wherein the die is inserted in a slot in the carrier, or with the leads of a single in-line package (SIP), one such structure being illustrated in U.S. Pat. No. 5,138,434, assigned to the assignee of the present invention.

Figure 10:
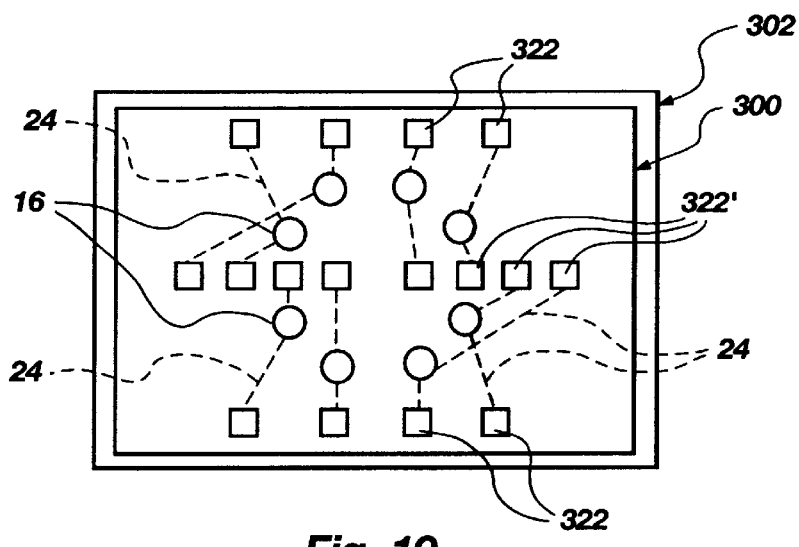
FIG. 10 is a top schematic view of two dice with different bond pads rerouted to a common circular array of I/O connections in accordance with the present invention.

FIG. 10 illustrates, for illustrative purposes, two superimposed dies 300 and 302, the first, smaller die (300) with two parallel rows of peripheral bond pads 322 and the second, larger die (302) with a central row of bond pads 322', each bond pad pattern being reconfigured into a common circular configuration or array of I/O external connections 16 such as conductive bumps. As is shown in broken lines, traces 24 may easily be configured to extend from each set of bond pads 322, 322' of the respective different dies to a common array of I/O external connections 16. An I/O array comprising multiple concentric external connections 16 might also be employed.

Figure 11:
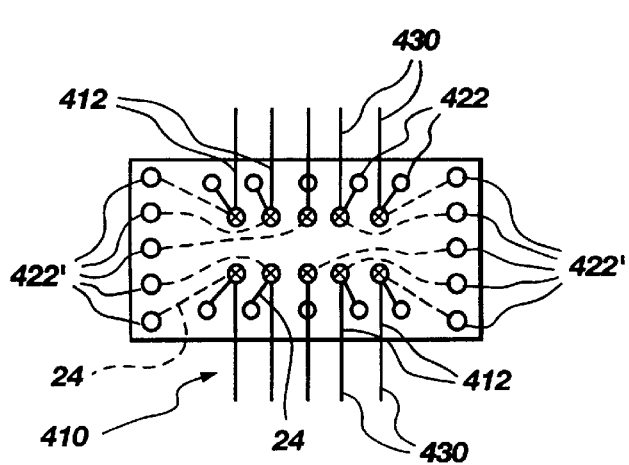
FIG. 11 is a top schematic view of two dice with different bond pads rerouted to accommodate a lead frame configured for yet another, different I/O pattern and providing a common external lead configuration.

FIG. 11 illustrates two exemplary superimposed dies of the same size, each die with a respective different arrangement of bumped bond pads 422 and 422', mountable to a leadframe 410, the inner lead ends 412 of the leadframe 410 being configured to accommodate a common, rerouted I/O pattern (cross-hatched) employed with both dice and to provide a common I/O arrangement of external lead ends 430 for connection to a substrate or other carrier. Bond pads 422 have been rerouted by traces 24 shown in solid lines, while bond pads 422' have been rerouted by traces 24 shown in broken lines. It will be understood that only one die I/O pattern need be rerouted if the lead frame is configured to match the I/O pattern of the other die. It will be appreciated, however, that in some instances the I/O patterns of both dice are desirably rerouted. FIG. 11 is also illustrative of the use of two face-to-face dice mounted, if desired, on opposing sides of a leadframe in a lead-between-chip (LBC) arrangement, and the manner in which LBC is facilitated by the invention.

It is contemplated that the use of a standardized die-to-substrate connection array is adaptable to conform different-sized dies and dies with different circuitry to standardized packaging employed by the industry for connection of a variety of dies to carriers such as printed circuit boards. For example, a substrate configured as an insert having external leads or other terminal or pin elements extending therefrom and a standardized array of terminals may receive and carry any die having a matching bump configuration, regardless of its size, origin, or even the type of integrated circuits carried thereon. For example, using the invention, a die with a peripheral bond pad arrangement may be substituted for one employing a central row of bond pads. Thus, a substrate configured with external leads for a small-outline J-lead package may carry any matching-connection die. The substrate may, in fact, be a leads-under-chip (LUC) or leads-over-chip (LOC) design lead frame, with inner lead ends configured as pads and suitably plated, if necessary, to bond with the connection bumps of the die. Of course, the aforementioned LBC arrangement with two facing dice and an interposed lead frame is also a viable arrangement. The resulting assembly may then be packaged, as by transfer molding of a plastic package. Alternatively, an insulative substrate defining a die carrier area with a terminal array and including leads, such as a ceramic substrate with leads extending therefrom, may receive a bumped die and a cover or other protection, such as a glob-top, preformed cover, or a dammed silicone gel, may be placed thereover. An insulative underfill may be employed between the die and substrate.

Those skilled in the art will appreciate that the layout of external connections for a semiconductor die according to the invention may be independent of the substrate and/or die materials used or the internal circuit configurations thereof. It will also be appreciated by one of ordinary skill in the art that one or more features of one of the illustrated embodiments may be combined with one or more features from another to form yet another combination within the scope of the invention as described and claimed herein. Thus, while certain representative embodiments and details have been shown for purposes of illustrating the invention, it will be apparent to those skilled in the art that various changes in the invention disclosed herein may be made without departing from the scope of the invention, which is defined in the appended claims. For example, various additional array configurations may be utilized; the number of generations of die shrinks employing a single standardized array may be increased or decreased; the number of external connections may vary; and the form of the die-size reduction may be altered to include one-dimensional shrinking in the plane of the die. The invention may be employed with functionally different dies mateable with the same substrate. For example, a SIMM (single in-line memory module) and a plug-in processor may be employed on a common design of daughter board, which, in turn, is connectable to a mother board. Only some of the bond pads of a die may be rerouted as desired, for example power and ground, to simplify external connections.

What is claimed is:

1. A semiconductor device, comprising:
   a carrier substrate including a plurality of conductors on a surface thereof, the conductors of the plurality being arranged to mate with an array of external connections of a pitch and pattern and located over and projecting from an active surface of a first die;
   a second die having an active surface with a plurality of bond pads arranged thereover in an arrangement at least partially different from the arrangement of the plurality of conductors on the surface of the carrier substrate;
   a plurality of external connections on the second die located over and projecting from an active surface thereof, at least some of the plurality of external connections on the secind die being offset from at least some of the plurality of bond pads thereof, said plurality of external connections arranged in an array over the active surface of the second die, the array of external connections of the second die being arranged to substantially correspond in pitch and pattern to the pitch and pattern of the external connections of the array located over the active surface of the first die, the plurality of external connections of the second die being in mating contact with the conductors of the plurality on the surface of the carrier substrate; and
   a plurality of circuit traces extending over the active surface of the second die and connecting at least some of the plurality of external connections on the second die to at least some of the plurality of bond pads on the second die;
   wherein the second die differs from the first die in at least one of the following respects: size, shape, bond pad arrangement and circuitry.

2. The semiconductor device of claim 1, wherein at least a portion of at least one of said plurality of circuit traces is disposed on a discrete layer of dielectric material residing on said active surface of said second die.

3. The semiconductor device of claim 2, wherein said dielectric material is selected from the group comprising a polyimide, a siloxane polyimide and a spin-on glass.

4. The semiconductor device of claim 1, wherein at least a portion of at least one of said plurality of circuit traces is covered by a dielectric material.

5. The semiconductor device of claim 4, wherein said dielectric material is selected from the group comprising a polyimide, a siloxane polyimide and a spin-on glass.

6. The semiconductor device of claim 1, wherein said external connection arrays of said first die and said second die comprise arrays of conductive bumps.

7. The semiconductor device of claim 6, wherein said bumps are of a material selected from the group comprising a reflowable metal material, a conductive polymer and a polymer carrying conductive material.

8. The semiconductor device of claim 6, wherein said external connection arrays of said first die and said second die each comprise a BGA.

9. The semiconductor device of claim 1, wherein said second die is reduced in size in at least one dimension in comparison to said first die.

10. The semiconductor device of claim 9, wherein said second die is a shrink of said first die.

11. The semiconductor device of claim 1, wherein said external arrays of connections of said arrays of said first die and said second die are arranged in a single row on a center line.

12. The semiconductor device of claim 1, wherein said external connections of said arrays of said first die and said second die are arranged in at least two rows.

13. The semiconductor device of claim 1, wherein said external connections of said arrays of said first die and said second die are arranged in a rectangular configuration comprising at least one rectangle of connections.

14. The semiconductor device of claim 1, wherein said external connections of said arrays of said first die and said second die are arranged in rows and columns.

15. The semiconductor device of claim 1, wherein said external connection array of each of said first die and said second die comprises a circular array including at least one circle of connections.

16. A process of manufacturing a semiconductor device, comprising:
fabricating a die having an active surface with a plurality of bond pads arranged on said die and over said active surface, wherein said fabricating said die includes shrinking another die which is larger in at least one external dimension than said die, said another die carrying an external connection array projecting from an active surface thereof;
extending a plurality of circuit traces on said die and over said active surface of said die from at least some of said bond pads of said plurality to remote locations over said active surface and offset from said at least some of said bond pads of said plurality; and
forming external connections projecting from said active surface of said die, at least some of said external connections of said die being disposed at said remote locations whereby said external connections of said die define an array of external connections of the same pattern and pitch as said external connection array projecting from said active surface of said another die.

17. The process of claim 16, further including covering at least a portion of at least one of said plurality of circuit traces with a layer of dielectric material.

18. The process of claim 16, further including forming at least a portion of at least one of said plurality of circuit traces over a layer of dielectric material applied to said active surface.

19. The process of claim 16, further including forming said external connections as conductive bumps.

20. The process of claim 19, wherein said external connections are formed of a material selected from the group comprising a metal, a conductive polymer, and a polymer carrying conductive material.

21. The process of claim 16, further including providing a substrate bearing conductors thereon having contact areas in a pattern matching said external connection array and connecting said die by said external connections of said array to at least some of said substrate conductor contact areas.

22. A method of designing a die-adaptable semiconductor device assembly, comprising:
identifying at least one integrated circuit function to be fabricated on an active surface of a semiconductor die;
identifying a number of external connections for electrically communicating said at least one integrated circuit function to external circuitry;
selecting an external connection array of a given configuration and pitch of connections for effecting said electrical communication between said active surface of a semiconductor die including said at least one integrated circuit function and said external circuitry; and
positioning a different, selected external connection array having said given configuration and pitch of connections on the active surface of each of at least two semiconductor dies to enable said electrical communication by each of said at least two semiconductor dies directly to said external circuitry through said external connection array, said at least two semiconductor dies differing in at least one of the following respects: size, shape, and bond pad arrangement, and each of said at least two semiconductor dies including said at least one identified integrated circuit function.

23. The method of claim 22, further comprising providing said at least two semiconductor dies in the form of a first die and a second die which comprises a shrink of said first die.

24. The method of claim 22, further comprising providing said at least two semiconductor dies in the form of first and second dies of different manufacturing origin.

25. The method of claim 22, further including configuring circuit traces on at least one of said at least two semiconductor dies extending between locations of said external connections of said external connection array on said at least one semiconductor die and at least some bond pad locations on the active surface of the same semiconductor die.

26. The method of claim 25, wherein said at least some bond pad locations are located peripherally on said active surface of said at least one of said at least two semiconductor dies, and further comprising locating said external connection array relatively centrally on said active surfaces of said at least two semiconductor dies.

27. The method of claim 22, further comprising providing said at least two semiconductor dies in the form of at least a first die and at least one shrink of said first die, and further including selecting a pattern of circuit traces whereby at least some of said circuit traces extend from at least some bond pad locations on said first die to at least some of said external connections and pass through at least some bond pad locations of said at least one shrink.

28. The method of claim 22, further comprising designing an external connection array adapter usable with at least one of said at least two semiconductor dies and carrying said selected external connection array thereon, said at least one of said at least two semiconductor dies including bond pads offset from locations of said selected external connection array, configuring said external connection array adapter for disposition on the active surface of said at least one of said at least two semiconductor dies and including circuit traces communicating between bond pad locations of said at least one of said at least two semiconductor dies and external connections of said selected external connection array on said external connection array adapter, said positioning of said external connection array on said at least one of said at least two semiconductor dies comprising applying said external connection array adapter to the active surface thereof with at least some bond pads of said at least one of said at least two semiconductor die in communication with at least some of said different, selected circuit traces.

29. A semiconductor device, comprising:
a plurality of external connections arranged in an array selected for disposition over, and to project from, an active surface of each of a first die and a second die, the second die differing from the first die in at least one of the following respects: size, shape, bond pad arrangement and circuitry, wherein the array of external connections is of a pitch and pattern suitable for mating with conductors carried on a surface of a substrate;
wherein each die of the first die and the second die carries external connections arranged in the array on an active surface thereof, at least one die of the first die and the second die includes a plurality of bond pads over an active surface thereof including integrated circuitry, at least some of the plurality of bond pads are located on the at least one die laterally offset from at least some external connection locations of the array carried thereon and a plurality of circuit traces extend over the active surface of the at least one die and connect the at least some of the plurality of bond pads on the at least one die to the at least some external connections of the array carried on the at least one die from which the at least some of the plurality of bond pads of the at least one die are laterally offset.

30. The semiconductor device of claim 29, wherein the plurality of circuit traces is formed on the at least one die.

31. The semiconductor device of claim 29, wherein the plurality of circuit traces is preformed on a dielectric carrier applied to said active surface of the at least one die.

32. The semiconductor device of claim 29, wherein the plurality of traces is at least partially covered by a dielectric material.

33. The semiconductor device of claim 29, wherein the external connections comprise conductive bumps.

34. A method of reconfiguring die I/O patterns, comprising:
selecting a first die having an active surface bearing a first I/O pattern on an active surface thereof;
selecting a second die having an active surface bearing a second I/O pattern on an active surface thereof, said second I/O pattern being different from said first I/O pattern; and
reconfiguring at least one of said first and said second active surface I/O patterns on an active surface of at least one of said respective dies so that said first die and said second die present a common I/O pattern from their respective active surfaces.

35. The method of claim 34, wherein said common I/O pattern differs from both said first I/O pattern and said second I/O pattern, and further comprising reconfiguring both of said first and second I/O patterns to present said common I/O pattern.

36. The semiconductor device of claim 12, wherein an arrangement of said at least two rows is selected from an arrangement wherein said at least two rows are mutually parallel and an arrangement wherein said at least two rows include a first row and a second row which are mutually perpendicular.

37. The semiconductor device of claim 14, wherein said external connections of a row are offset from said external connections of at least one adjacent row.

38. A process of manufacturing a semiconductor device, comprising:
fabricating a die having an active surface with a plurality of bond pads arranged on said die and over said active surface, said die differing from another selected die in at least one of the following respects: size, shape, bond pad arrangement and circuitry, said another selected die carrying an external connection array thereon;
extending a plurality of circuit traces on said die and over said active surface thereof from at least some of said bond pads to locations over said active surface remote therefrom and laterally offset from said at least some bond pads; and
forming external connections projecting from said active surface of said die at locations including said locations remote from said at least some of said bond pads to define an array of external connections of the same pattern and pitch as a pattern and pitch of said external connection array of said another selected die.

* * * * *